United States Patent
Nozawa

(10) Patent No.: US 9,896,762 B1
(45) Date of Patent: Feb. 20, 2018

(54) METHOD OF DEPOSITING AND ETCHING FILM IN ONE PROCESSING APPARATUS

(71) Applicant: ASM IP HOLDING B.V., Almere (NL)

(72) Inventor: Toshihisa Nozawa, Kawasaki (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/382,141

(22) Filed: Dec. 16, 2016

(51) Int. Cl.
| | |
|---|---|
| *C23C 16/50* | (2006.01) |
| *C23C 16/455* | (2006.01) |
| *H01J 37/32* | (2006.01) |
| *C23C 16/458* | (2006.01) |
| *C23C 16/44* | (2006.01) |

(52) U.S. Cl.
CPC .... *C23C 16/45525* (2013.01); *C23C 16/4412* (2013.01); *C23C 16/458* (2013.01); *C23C 16/50* (2013.01); *H01J 37/32091* (2013.01); *H01J 37/32532* (2013.01); *H01J 2237/334* (2013.01); *H01J 2237/3321* (2013.01)

(58) Field of Classification Search
CPC . C23C 16/45525; C23C 16/458; C23C 16/50; C23C 16/4412; H01J 37/32532; H01J 37/32091; H01J 2237/3321; H01J 2237/334
See application file for complete search history.

(56) References Cited

U.S. PATENT DOCUMENTS

| | | | |
|---|---|---|---|
| 8,669,185 B2 | 3/2014 | Onizawa et al. | |
| 2003/0172872 A1* | 9/2003 | Thakur | C23C 16/4412 118/715 |
| 2010/0140802 A1 | 6/2010 | Matsumoto et al. | |
| 2014/0000810 A1* | 1/2014 | Franklin | H01L 21/67069 156/345.48 |
| 2015/0104648 A1* | 4/2015 | Wang | H01J 37/32889 428/408 |
| 2016/0163557 A1* | 6/2016 | Hudson | H01L 21/30655 438/696 |
| 2016/0322215 A1* | 11/2016 | Shaikh | H01J 37/00 |

FOREIGN PATENT DOCUMENTS

| | | |
|---|---|---|
| JP | 2013/219380 | 10/2013 |
| JP | 2016/021463 | 2/2016 |

\* cited by examiner

*Primary Examiner* — Duy Deo
*Assistant Examiner* — Mahmoud Dahimene
(74) *Attorney, Agent, or Firm* — Pillsbury Winthrop Shaw Pittman LLP

(57) ABSTRACT

A method of forming layers of film on a patterned surface, including depositing a film on the patterned surface during a PEALD/PPECVD process in a processing apparatus and etching the film during the etching process in the processing apparatus.

11 Claims, 2 Drawing Sheets

METHOD OF DEPOSITING AND ETCHING FILM IN ONE PROCESSING APPARATUS

BACKGROUND

1. Field

The present description relates generally to a method of repeating, multiple times, a deposition of film by plasma enhanced atomic layer deposition (PEALD) or pulsed plasma enhanced chemical vapor deposition (PPECVD), and etching of film.

2. Description of the Related Art

PPECVD/PEALD processes can provide high conformality (also referred to as "coverage") of depositing films on a patterned surface on which multiple recesses or grooves are formed in patterns for establishing interconnects. The substrate temperature of PEALD processes are typically lower than that of thermal ALD, and PEALD processes are typically better than thermal ALD in terms of deposition rates and controllability, depending on the type of films.

Any discussion of the background art which has been included in the present disclosure is solely for the purpose of providing a context for the present invention, and it should not be taken as an admission that any or all of the discussion form part of the prior art or were known in the art at the time the invention was made.

SUMMARY

In recent years, methods for tailoring conformality of film deposited on a patterned surface have been proposed by combining depositing a film by PEALD/PPECVD processes on the patterned surface and etching the film. Normally, the cycle of this combination is repeated multiple times to form target layers of film on a patterned surface.

The demand in terms of time and speed for forming film on a patterned surface is increasing. Conventionally, depositing and etching processes are individually and separately conducted in different processing apparatuses. However, the overall processing efficiency cannot be sufficiently high, as whenever each process completes, the subject substrate needs to be retrieved from one processing apparatus that performed a deposition session and then transferred to another processing apparatus for performing an etching session and vice versa.

Existing deposition and etching sessions may be conducted either in a deposition processing apparatus or in an etching processing apparatus. However, such apparatus is basically made for specifically performing either a deposition session or an etching session, and thus the deposition processing apparatus is not appropriate or effective enough in also performing the etching session and vice versa.

Thus development of one processing apparatus that can perform both a deposition session and an etching session effectively and efficiently becomes important and desired.

In an aspect, an embodiment of the present invention provides a method of forming layers of film on a patterned surface, comprising depositing film on a patterned surface during a PEALD/PPECVD process in a processing apparatus and etching the film during an etching process in the same processing apparatus.

In an embodiment, the etching can be in situ plasma etching (etching gas is excited in the reactor). In an embodiment, the combination of deposition session and etching session can be repeated multiple times in one processing apparatus to form target layers of film on a patterned surface.

In an embodiment, the position of the substrate is different between the deposition session and the etching session. In an embodiment, at least two exhaust ports are located to exhaust gas within the processing apparatus, and one exhaust port is used exclusively for the deposition session and another exhaust port is used exclusively for the etching session.

For purposes of summarizing aspects of the invention and one or more advantages achieved over the related art, certain objects and advantages of the invention are described in this disclosure. Of course, it is to be understood that not necessarily all or any such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving one or more other objects or advantages as may be taught or suggested herein. Further aspects, features and advantages of this invention will become apparent from the detailed description which follows.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DESCRIPTION OF EMBODIMENTS

Figure 1:
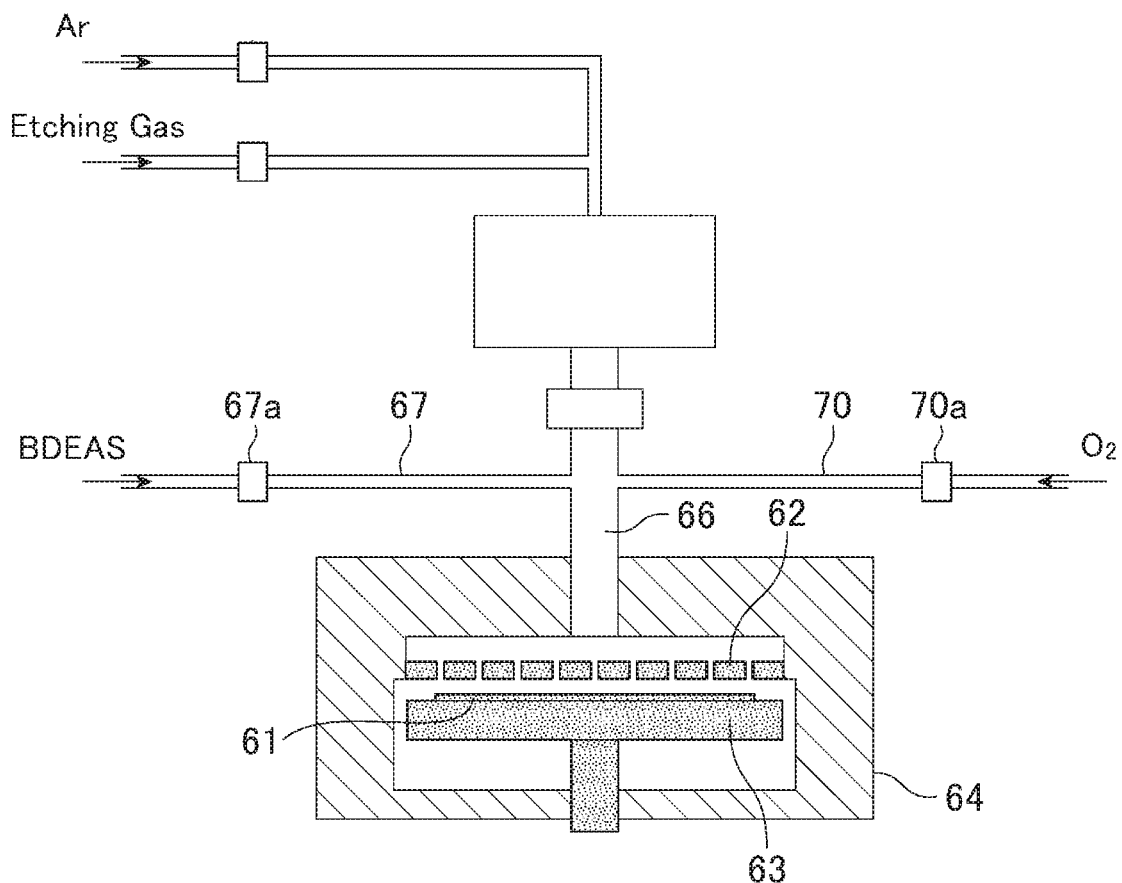
FIG. 1 is a schematic drawing showing a processing apparatus used for deposition and etching according to an embodiment of the present invention.

The present invention includes, but is not limited to, the following embodiments:

First, an overview of an embodiment of the processing apparatus is explained. As illustrated in FIG. 1, a substrate 61 is placed on a susceptor 63 in a reaction chamber 64 configured for evacuation. A shower plate 62 is disposed parallel to the susceptor 63. In an embodiment, during the deposition session, Bisdiethylaminosilane (BDEAS) is introduced in pulses into the reaction chamber 64 through a valve 67a, a line 67, a gas inlet port 66, and the shower plate 62. O₂ is introduced continuously into the reaction chamber 64 through a valve 70a, a line 70, the gas inlet port 66, and the shower plate 62.

The gas inside the reaction chamber 64 is discharged through an exhaust port (not shown). RF power from a RF power source (not shown) is applied to the shower plate 62, and the susceptor 63 is grounded (not shown). After the deposition session, etching is initiated. Another exhaust port and the susceptor are controlled when in transition from the deposition session to the etching session, which will be more specifically explained below.

During the etching session, Ar is introduced into the reaction chamber 64 through a valve 69a, a line 69, a remote plasma unit (RPU) 68, a valve 65, the gas inlet port 66, and the shower plate 62. The etching gas is also introduced into the reaction chamber 64 through a valve 69b, a line 69, the remote plasma unit 68, the valve 65, the gas inlet port 66, and the shower plate 62. The etching gas is activated by RPU 68. The gas inside the reaction chamber 64 is discharged through an exhaust port. In an embodiment, the RF power may be applied using capacitively coupled parallel electrodes, and the susceptor functions as a lower electrode and holds a single substrate.

In an embodiment of the present invention, electrically conductive flat-plate electrodes which are in parallel and face each other in the interior of a reaction chamber, are configured to apply HRF power (13.56 MHz or 27 MHz) and LRF power of 5 MHz or less (400 kHz-500 kHz) to one side, and are electrically grounded at another side, so that a plasma is excited between the electrodes. A temperature regulator is provided in a lower stage (the lower electrode), and a temperature of a substrate placed thereon is kept constant at a given temperature. The upper electrode serves as a shower plate as well, and reaction gas and rare gas are introduced into the reaction chamber through a gas flow controller, a pulse flow control valve, and the shower plate. Additionally, in the reaction chamber, at least two exhaust ports are provided, through which gas in the interior of the reaction chamber is exhausted. Additionally, the reaction chamber is provided with a seal gas flow controller to introduce seal gas into the interior of the reaction chamber. At least one exhaust port and the susceptor are controlled when in transition from the etching session to the deposition session, which will be more specifically explained below.

In an embodiment of the present invention, as in FIG. 1, one processing apparatus performs both a deposition session and an etching session using basically the same reaction chamber, and purging is conducted therebetween.

Figure 2:
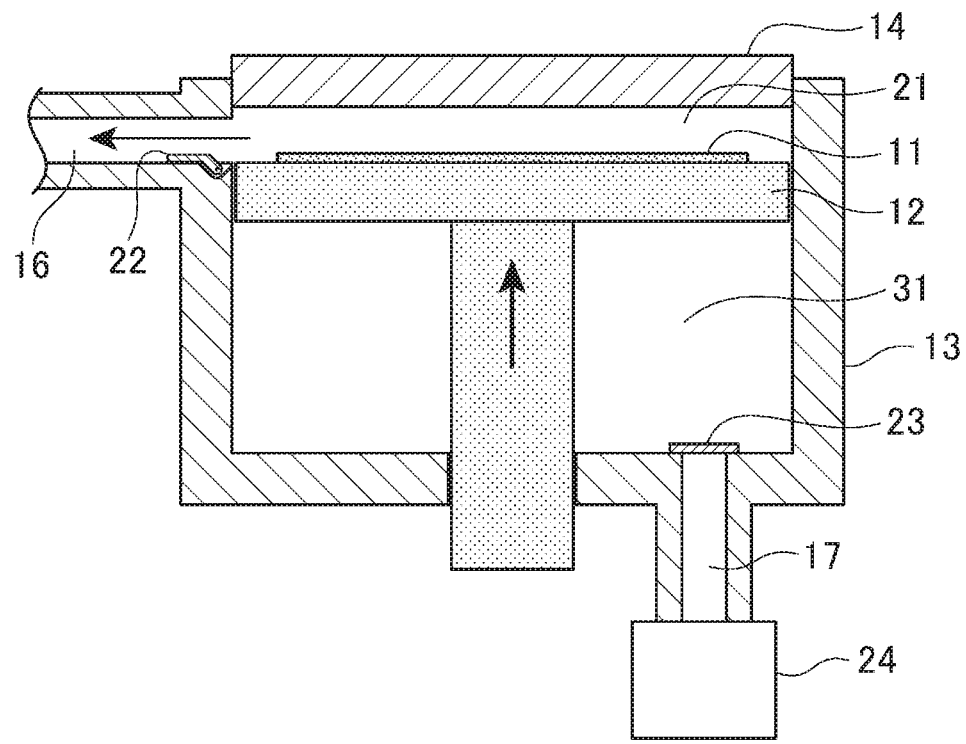
FIG. 2 is a schematic drawing showing a processing apparatus during a deposition session according to an embodiment of the present invention.

FIG. 2 more specifically shows an embodiment during a deposition session of an embodiment as depicted in FIG. 1. As shown in FIG. 2, a substrate 11 is placed on a susceptor 12 in a reaction chamber 13. A shower plate 14 is disposed parallel to the susceptor 12. In an embodiment, during the deposition session, the substrate 11 is located approximately 10 mm from the surface of the shower plate 14. This can be realized by controlling the susceptor 12 on which the substrate 11 is placed to a desirable position within an interior 31 of the reaction chamber 13. During the deposition session, an exhaust port 16 is exclusively used for exhausting gas within a reactive space 21. During the deposition, a valve 22 remains open such that gas within the reactive space 21 can be properly removed through the exhaust port 16. There may be multiple exhaust ports to be used for the deposition session.

Figure 3:
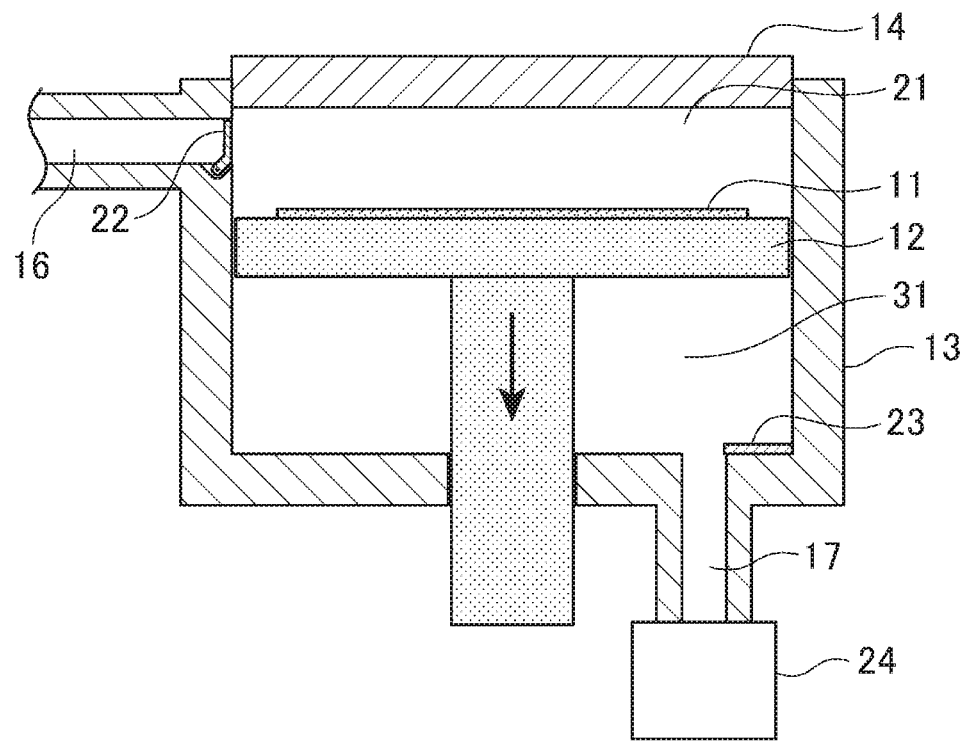
FIG. 3 is a schematic drawing showing a processing apparatus during an etching session according to an embodiment of the present invention.

FIG. 3 shows an embodiment during an etching session of an embodiment as depicted in FIG. 1. As shown in FIG. 3, a substrate 11 is placed on a susceptor 12 in a reaction chamber 13. A shower plate 14 is disposed parallel to the susceptor 12. In an embodiment, during the etching session, the substrate 11 is located approximately between 50 mm and 100 mm away from the surface of the shower plate 14. This can be realized by controlling the susceptor 12 on which the substrate 11 is placed to a desirable position within an interior 31 of the reaction chamber 13. During the etching session, an exhaust port 17, instead of the exhaust port 16, is used for exhausting gas within a reactive space 21. During the etching, a valve 23 remains open such that gas within the reactive space 21 can be properly extracted by a turbomolecular pump (TMP) 24 through the exhaust port 16. There may be multiple exhaust ports to be used for the etching session.

As noted above, the substrate is located between a susceptor and a shower plate, and the position of the susceptor during the deposition session and the etching session differs with respect to a direction perpendicular to a surface of the substrate. The distance between the susceptor and the shower plate during the etching session becomes larger than that during the deposition session. The distance between the susceptor and the shower plate during the etching session may be 40-90 mm larger than that during the deposition session.

As noted, there may be at least two exhaust ports located to exhaust gas within the processing apparatus, and one exhaust port is used exclusively for the deposition session and another exhaust port is used exclusively for the etching session. An exhaust port may be located in a lateral direction of a reactive space formed between the susceptor and the shower plate, and used during the deposition session. Another exhaust port may be located in a lower portion of the processing apparatus than the susceptor, and used during the etching session. The position of the susceptor may be changed such that the volume of a reaction chamber during the etching session becomes larger than that during the deposition session. Further, the position of the substrate may be adjusted such that the volume of a reactive space during the etching session becomes 5-10 times larger than that during the deposition session.

In this manner, the processing apparatus according to an embodiment of the present invention performs both the deposition and etching sessions more rapidly and efficiently than performing deposition and etching using a conventional processing apparatus. The processing apparatus can perform two sessions while substantially eliminating intermediate time (e.g., the time to transfer a substrate from a deposition apparatus to an etching apparatus and vice versa).

The processing apparatus according to an embodiment of the present invention can perform the deposition session as efficiently and speedily as a conventional deposition apparatus, and can also perform the etching session as efficiently and speedily as a conventional etching apparatus. Thus, the processing apparatus according to an embodiment of the present invention can perform both the deposition session and the etching session much more efficiently and speedily than a conventional deposition apparatus can perform both the deposition and the etching sessions. Also, the processing apparatus according to an embodiment of the present invention can perform both the deposition session and the etching session much more efficiently and speedily than a conventional etching apparatus can perform both the deposition and the etching sessions.

The present invention will be explained in detail with reference to specific examples which are not intended to limit the present invention. The numerical numbers applied in specific examples may be modified by a range of at least ±50%, wherein the endpoints of the ranges may be included or excluded.

EXAMPLE

Deposition of a silicon oxide or silicon nitride film

First, in this example, a silicon oxide or silicon nitride film was deposited on a substrate, and a Capacitively Coupled Plasma (CCP) device was used as the ALD apparatus. The film deposition conditions were as follows:
  Substrate temperature: 200° C.
  Film deposition pressure: 20 Pa
  Silicon-containing precursor: BDEAS
  Flow rate of $O_2$ when depositing a silicon oxide film: 5 ccm
  Flow rate of nitrogen or nitrogen and hydrogen when depositing a silicon nitride film: 20 ccm
  Flow rate of purge gas (Ar): 100 ccm
  Upper RF power (13.56 MHz): 500 W
  Lower RF bias power: 0 W
  Flow rate of exhaust port: 5-10 l/min
  Distance between shower plate and susceptor: approximately 10 mm
  Diameter of reactive space: 450 mm
  Valve for exhaust port for deposition session: Open
  APC valve for exhaust port for etching session: Closed
  TMP: Off Under the above conditions, the processing apparatus performs approximately 100 cycles of a deposition session with formation of 10 nm of thickness of film each cycle. During the deposition session, the valve for the exhaust port located in lateral direction from the reactive space was opened and then the exhaust port was used to exhaust gas, while the valve for another exhaust port for the etching session was closed. After the deposition session, the valve for the exhaust port for the deposition session was closed and the valve for another exhaust port for the etching session was opened by the controlling APC. Then the susceptor was moved approximately 40-90 mm downwardly to prepare for the next etching session.

Etching of a silicon oxide or silicon nitride film

Second, a silicon oxide film or a silicon nitride film on a substrate was then etched, and a Capacitively Coupled Plasma (CCP) device was used as the etching apparatus. The film etching conditions were as follows:
  Substrate temperature: 200° C.
  Etching gas: $CF_4$
  Film etching pressure: 20 Pa
  Flow rate of etching gas: 20 ccm
  Flow rate of purge gas (Ar): 100 ccm
  Etching gas supply time: Continuously supplied during etching session
  Etching rate: 40 nm/min
  Upper RF power (13.56 MHz): 500 W
  Lower RF bias power: 200 W
  Flow rate of exhaust port: 5-10 l/min
  Length between shower plate and susceptor: approximately 50-100 mm
  Diameter of reactive space: 450 mm
  Valve for exhaust port for deposition session: Closed
  APC valve for exhaust port for etching session: Open or controlled
  TMP: On Under the above conditions, the same processing apparatus thereafter performs an etching session. During the etching session, the valve for another exhaust port located in a lower portion of the reaction chamber was opened and then the exhaust port in the lower portion of the reaction chamber was used to exhaust gas, while the valve for the exhaust port for a deposition session was closed. After the etching session, the valve for the exhaust port for the etching session was closed by the controlling APC and the valve for the exhaust port for deposition session was opened. Then the susceptor was moved approximately 40-90 mm upwardly such that the distance between the shower plate and the susceptor becomes approximately 10 mm to prepare for a next deposition session.

With respect to the use of any plural and/or singular terms herein, those having skill in the art can translate from the plural to the singular and/or from the singular to the plural as is appropriate to the context.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A method of forming layers of film on a patterned surface of a substrate, the method comprising:
  depositing a film by PEALD on the patterned surface during a deposition session in a processing apparatus;
  etching the film on the patterned surface during an etching session in the same processing apparatus; and
  repeating the depositing and etching to satisfy a thickness of a target layer of film in the same processing apparatus,
  wherein the substrate is located between a susceptor and a shower plate, and the distance between the susceptor and the shower plate during the etching session is larger than that during the deposition session, and
  wherein at least two exhaust ports are located to exhaust gas within the processing apparatus, and one exhaust port is used exclusively for the deposition session and another exhaust port is used exclusively for the etching session, the one exhaust port being located in a lateral direction of a reactive space formed between the susceptor and the shower plate and the another exhaust port being located in a lower portion of the processing apparatus than the susceptor.

2. The method according to claim 1, wherein the position of the substrate is different between the deposition session and the etching session.

3. The method according to claim 1, wherein the position of the susceptor during the deposition session and the etching session differs with respect to a direction perpendicular to a surface of the substrate.

4. The method according to claim 1, wherein the distance between the susceptor and the shower plate during the etching session is 40-90 mm larger than that during the deposition session.

5. The method according to claim 1, wherein the susceptor and the shower plate are located in parallel to one another.

6. The method according to claim 1, further comprising, between the depositing and the etching, changing the position of the susceptor such that a volume of a reaction chamber during the etching session becomes larger than that during the deposition session.

7. The method according to claim 1, further comprising, between the depositing and the etching, changing the position of the substrate such that a volume of a reactive space during the etching session becomes 5-10 times larger than that during the deposition session.

8. The method according to claim 1, wherein excited etching gas is produced by applying RF power to an etching gas introduced into a reaction chamber where the substrate is placed.

9. The method according to claim 1, wherein the one exhaust port is closed during the etching session and the another exhaust port is closed during the deposition session.

10. The method according to claim 1, wherein the etching is conducted by using a capacitively coupled plasma (CCP) device.

11. The method according to claim 1, wherein RF power is applied using capacitively coupled parallel electrodes, and the susceptor functions as a lower electrode and holds a single substrate.

\* \* \* \* \*